(12) United States Patent
Renn

(10) Patent No.: US 8,077,512 B2
(45) Date of Patent: Dec. 13, 2011

(54) FLASH MEMORY CELL AND METHOD FOR OPERATING THE SAME

(75) Inventor: Shing Hwa Renn, Taipei (TW)

(73) Assignee: Nanya Technology Corp., Kueishan (TW)

( * ) Notice: Subject to any disclaimer, the term of this patent is extended or adjusted under 35 U.S.C. 154(b) by 205 days.

(21) Appl. No.: 12/543,234

(22) Filed: Aug. 18, 2009

(65) Prior Publication Data

US 2011/0044100 A1 Feb. 24, 2011

(51) Int. Cl.
*G11C 16/04* (2006.01)
(52) U.S. Cl. .......... 365/185.03; 365/185.05; 365/185.18
(58) Field of Classification Search ............. 365/185.03, 365/185.05, 185.18
See application file for complete search history.

(56) References Cited

U.S. PATENT DOCUMENTS 7,112,490 B1 * 9/2006 Hong et al. ............... 438/259
2008/0265302 A1 10/2008 Hsiao et al.

* cited by examiner

*Primary Examiner* — Huan Hoang
(74) *Attorney, Agent, or Firm* — Hamre, Schumann, Mueller & Larson, P.C.

(57) ABSTRACT

A flash memory cell according to the present invention includes a first charge-trapping region and a second charge-trapping region disposed in a semiconductor substrate, a first doped region disposed in the semiconductor substrate at a first side of the first charge-trapping region, a second doped region disposed in the semiconductor substrate at a second side of the first charge-trapping region, a first dielectric layer separating the semiconductor substrate from the first charge-trapping region and the second charge-trapping region, a first conductor disposed above the first charge-trapping region, and a second dielectric layer separating the first charge-trapping region from the first conductor, wherein the second charge-trapping region is configured to influence the conduction behavior of a carrier channel in the semiconductor substrate under the first charge-trapping region.

16 Claims, 6 Drawing Sheets

FLASH MEMORY CELL AND METHOD FOR OPERATING THE SAME

BACKGROUND OF THE INVENTION (1) Field of the Invention

The present invention relates to a flash memory cell and method for operating the same, and more particularly, to a multi-bit flash memory cell having a theoretical minimum area of 8 $F^2$ and method for operating the same.

(2) Description of the Related Art

A flash memory device is a type of non-volatile memory that allows multiple data writing, reading and erasing operations. The stored data of flash memory is retained even after power to the device is removed. With these advantages, flash memory has been broadly applied to personal computer and electronic equipment. One typical flash memory cell used in the flash memory is a tunnel oxide EPROM cell known as an ETOX-type cell (ETOX is a trademark of Intel Corp.).

FIG. 1 is a cross-sectional view of an ETOX-type cell 10 according to the prior art. The ETOX-type cell 10 includes a substrate 12 of one conductivity type such as P-type, a source region 14 and a drain region 16 of the opposite conductivity type such as N-type selectively provided in the substrate 12, a gate insulating film (a tunnel insulating film) 18 provided on the substrate surface, a floating gate 20 (a floating gate electrode) provided above the substrate 12 via the gate insulating film 18 between the source region 14 and the drain region 16, and a control gate (a control gate electrode) 24 provided above the floating gate 20 via an interlayer insulating film 22.

In such a flash memory cell, during writing (programming) operation a low voltage (for example, 0V) is given as the source voltage VS, a low voltage (for example, 0V) is applied to the substrate 12, a high voltage VPP (for example, 12V) is given as the control gate voltage VCG, and a high voltage is applied as the drain voltage VD. Consequently, a turn-on current flows between the drain region 16 and the source region 14, producing pairs of hot electrons and hot holes in the vicinity of the drain region 16. Those holes flow into the substrate 12 as a substrate current. In contrast, hot electrons are injected into the floating gate 20 to increase the threshold level with respect to the control gate 24, thereby completing the writing operation.

Data-erasing is carried out by applying the high voltage VPP and a low voltage (for example, 0V) to the source region 14 and the control gate 24, respectively, and setting the drain region 16 to a floating condition. At this state, a floating gate potential voltage VFG is set according to both the ratio of the capacity between the control gate 24 and the floating gate 20 to the capacity between the floating gate 20 and the source region 14, and the source voltage VS. Therefore, Fowler-Nordheim tunnel current flows through the thin tunnel insulating film 18 (approximately 10 nm) provided between the source region 14 and floating gate 20. Thus, electrons are reduced from the floating gate 20 to complete the erasing operation (the threshold level becomes the condition before writing).

SUMMARY OF THE INVENTION

One aspect of the present invention provides a multi-bit flash memory cell having a theoretical minimum area of 8 $F^2$ and method for operating the same.

A flash memory cell according to this aspect of the present invention comprises a first charge-trapping region and a second charge-trapping region disposed in a semiconductor substrate, a first doped region disposed in the semiconductor substrate at a first side of the first charge-trapping region, a second doped region disposed in the semiconductor substrate at a second side of the first charge-trapping region, a first dielectric layer separating the semiconductor substrate from the first charge-trapping region and the second charge-trapping region, a first conductor disposed above the first charge-trapping region, and a second dielectric layer separating the first charge-trapping region from the first conductor, wherein the second charge-trapping region is configured to influence the conduction behavior of a carrier channel in the semiconductor substrate under the first charge-trapping region.

Another aspect of the present invention provides a method for applying a first voltage to a first conductor disposed above a first charge-trapping region in a semiconductor substrate, applying a second voltage to a second conductor disposed above a second charge-trapping region in the semiconductor substrate, applying a third voltage to a first doped region disposed in the semiconductor substrate at a first side of the first charge-trapping region, and applying a fourth voltage to a second doped region disposed in the semiconductor substrate at a second side of the first charge-trapping region, wherein during a programming operation, the third voltage is a ground voltage, the fourth voltage is positive, and the first voltage and the second voltage are in the range from the third voltage to the fourth voltage.

The foregoing has outlined rather broadly the features of the present invention in order that the detailed description of the invention that follows may be better understood. Additional features of the invention will be described hereinafter, and form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

The objectives of the present invention will become apparent upon reading the following description and upon reference to the accompanying drawings in which.

DETAILED DESCRIPTION OF THE INVENTION

Figure 1:
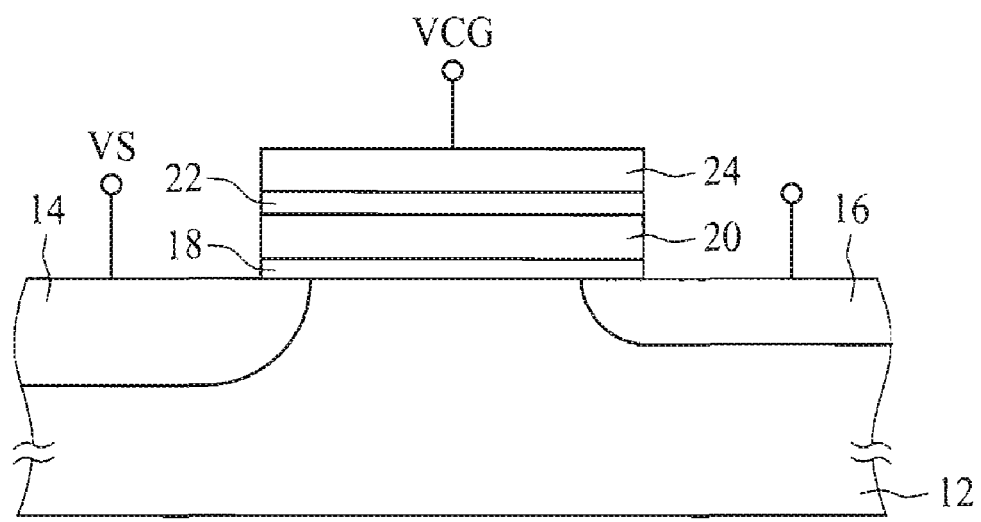
FIG. 1 is a cross-sectional view of an ETOX-type cell according to the prior art.
Figure 2:
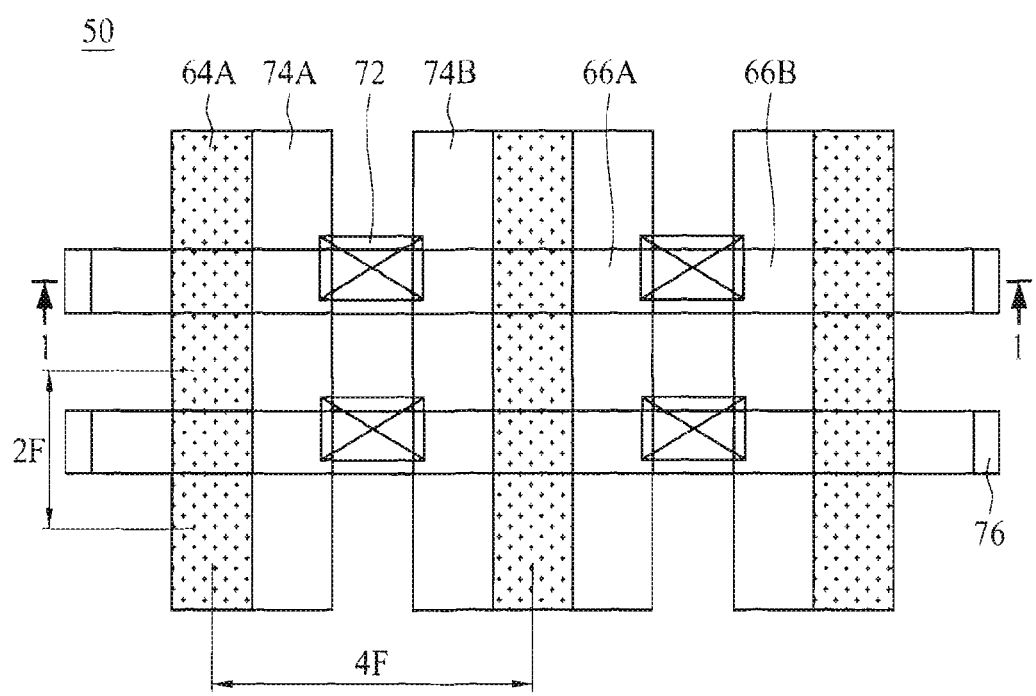
FIG. 2 and FIG. 3 illustrate a flash memory cell according to one embodiment of the present invention.
Figure 3:
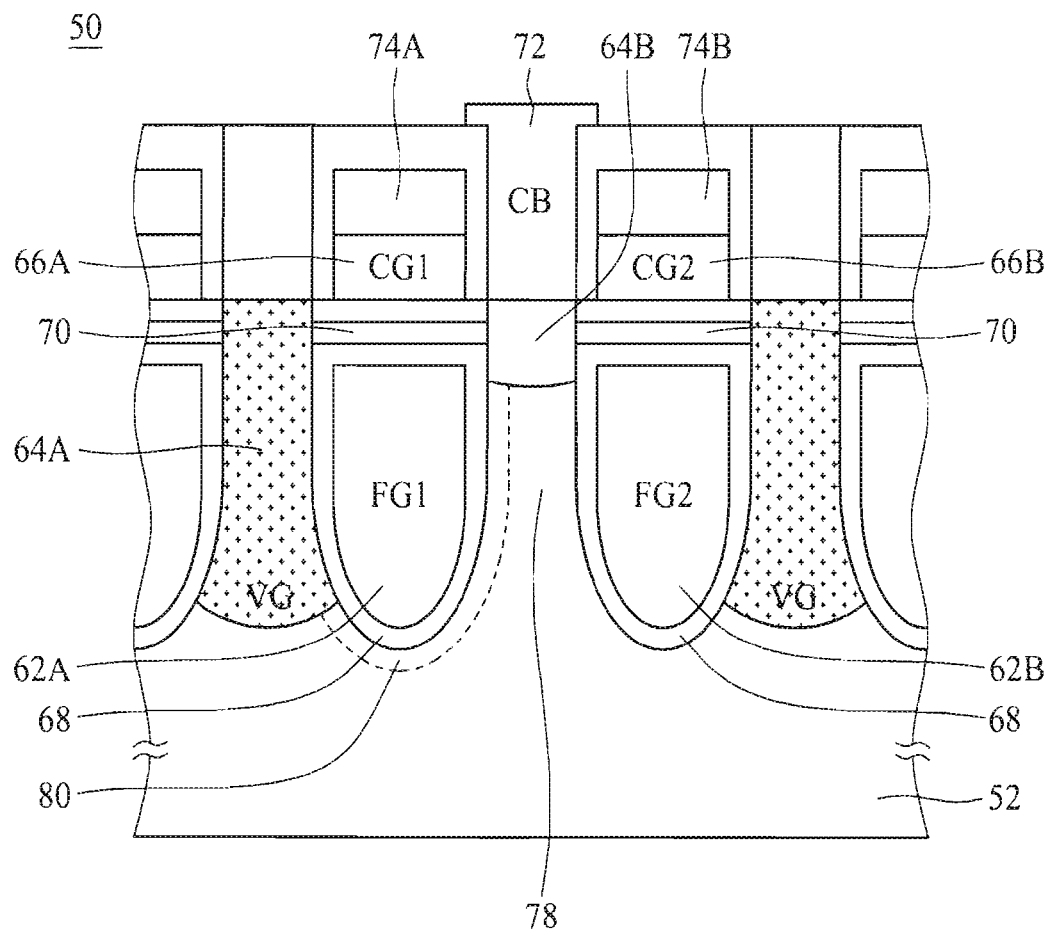

FIG. 2 and FIG. 3 illustrate a flash memory cell 50 according to one embodiment of the present invention, wherein FIG. 3 is a cross-sectional view along the cross-sectional line 1-1 in FIG. 2. The flash memory cell 50 comprises a semiconductor substrate 52, a first charge-trapping region 62A and a second charge-trapping region 62B disposed in the semiconductor substrate 52, a first doped region 64A disposed in the semiconductor substrate 52 at a first side of the first charge-trapping region 62A, a second doped region 64B disposed in the semiconductor substrate 52 at a second side of the first charge-trapping region 62A, a first dielectric layer 68 separating the semiconductor substrate 52 from the first charge-trapping region 62A and the second charge-trapping region 62B, a first conductor 66A disposed above the first charge-trapping region 62A, and a second conductor 66B disposed above the second charge-trapping region 62B.

A second dielectric layer 70 separates the first charge-trapping region 62A from the first conductor 66A and separates the second charge-trapping region 62B from the second conductor 66B. A bit line 76 electrically connects the second doped region 64B at the same row via a bit line contact 72, and a first word line 74A electrically connects the first conductor 66A at the same column, and a second word line 74B electrically connects the second conductor 66B at the same column. The flash memory cell 50 has a longitudinal width of 2 F and a lateral width of 4 F, i.e., the flash memory cell 50 has a theoretical minimum area of 8 $F^2$, wherein F represents the critical dimension (CD)

The first dielectric layer 68 serves as a tunnel oxide layer and electrically separates the second doped region 64B from the first charge-trapping region 62A and the second charge-trapping region 62B, and the second doped region 64B is sandwiched between the first charge-trapping region 62A and the second charge-trapping region 62B, i.e., the first charge-trapping region 62A and the second charge-trapping region 62B form a double gate structure such that a fully depleted region 78 is formed in the semiconductor substrate 52 below the second doped region 64B and between the first charge-trapping region 62A and the second charge-trapping region 62B during a reading operation. In one embodiment of the present invention, the first conductor 66A and the second conductor 66B are arranged in mirror-image symmetry with respect to the second doped region 64B. Similarly, the first charge-trapping region 62A and the second charge-trapping region 62B are arranged in mirror-image symmetry with respect to the second doped region 64B. Consequently, the first conductor 66A and the second conductor 66B can be fabricated in the same fabrication process, and the first charge-trapping region 62A and the second charge-trapping region 62B can be fabricated in the same fabrication process.

Figure 4:
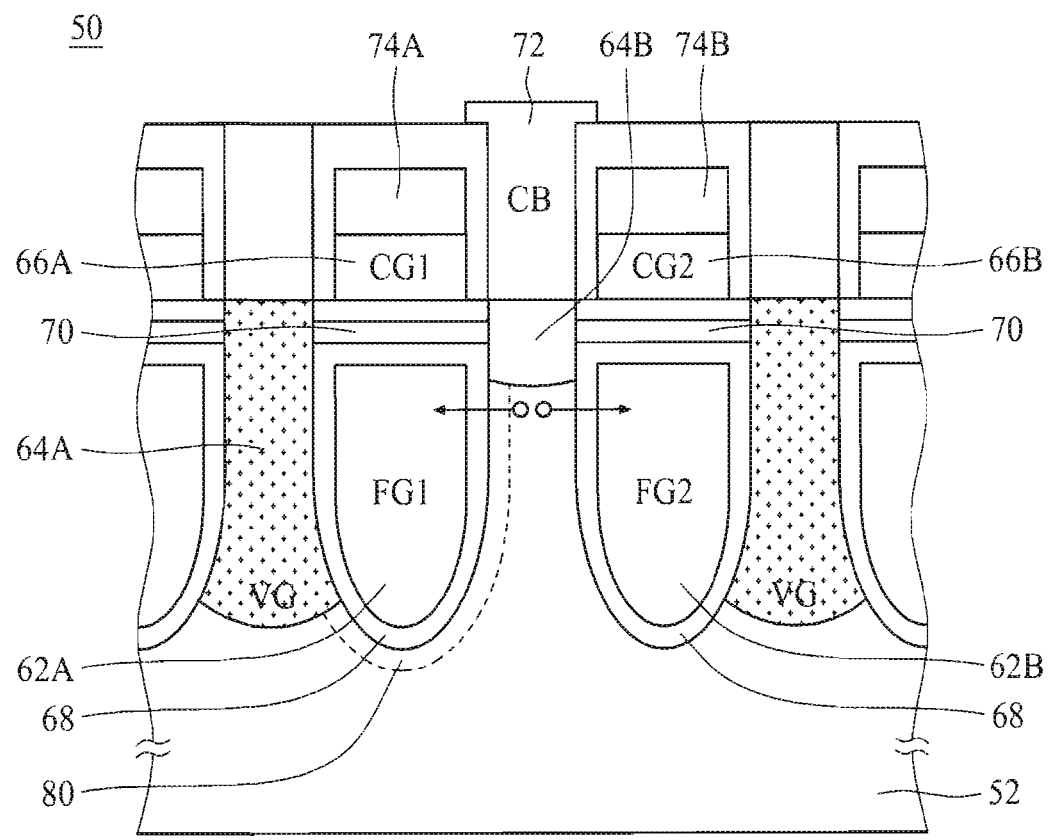
FIG. 4 illustrates the programming operation of the flash memory cell according to one embodiment of the present invention.

In one embodiment of the present invention, the substrate 52 is a silicon wafer or a well in a silicon wafer, the first conductor 66A and the second conductor 66B include polysilicon such as doped polysilicon serving as the control gate (CG1 & CG2), the first charge-trapping region 62A and the second charge-trapping region 62B include polysilicon such as doped polysilicon serving as the floating gate (FG1 & FG2), the first word line 74A and the second word line 74B include metal silicide, and the first dielectric layer 68 is a silicon oxide layer serving as the gate oxide layer, and the second dielectric layer 70 serves as the inter-gate dielectric layer including silicon oxide, silicon nitride or the combination thereof, FIG. 4 illustrates the programming operation of the flash memory cell 50 according to one embodiment of the present invention. The first conductor 66A and the second conductor 66B serve as the control gates (CG1 & CG2), and the first charge-trapping region 62A and the second charge-trapping region 62B serve as the floating gates (FG1 & FG2). The term "programming operation" is used herein to refer to an operation of placing electrons onto the floating gate. To perform the programming operation, a first voltage is applied to the first conductor 66A via the first word line 74A, a second voltage is applied to the second conductor 66B via the second word line 74B, a third voltage (VG) is applied to the first doped region 64A, and a fourth voltage is applied to the second doped region 64B via the bit line contact 72 (CB) disposed on the second doped region 64B. Consequently, charge carriers, i.e., electrons, are injected into the floating gates through the hot electron injection mechanism. In one embodiment of the present invention, the third voltage is a ground voltage, the fourth voltage is positive, and the first voltage and the second voltage are selected from the range of the third voltage to the fourth voltage.

By adjusting the voltage applied to the first conductor 66A or to the second conductor 66B, the amount of electrons injected into the floating gates can be controlled. In other words, the first conductor 66A is configured to control a charging level of the first charge-trapping region 62A, and the second conductor 66B is configured to control a charging level of the second charge-trapping region 62B.

Since the first charge-trapping region 62A and the second charge-trapping region 62B form a double gate structure, the second charge-trapping region 62B can influence the conduction behavior of a carrier channel 80 in the semiconductor substrate 52 under the first charge-trapping region 62A. In other words, the threshold voltage to turn on the carrier channel 80 in the semiconductor substrate 52 under the first charge-trapping region 62A not only depends on the charging level of the first charge-trapping region 62A, but also on the charging level of the second charge-trapping region 62B. Consequently, the threshold voltage Vth to turn on the carrier channel 80 can be adjusted to one of the four levels, as shown in the following table:

| Programming biasing condition | | | | |
|---|---|---|---|---|
| CB | VG | CG1 | CG2 | Vth |
| High | Ground | High | High | +++ |
| | | High | Low | ++ |
| | | Low | High | + |
| | | Low | Low | Low |

Figure 5:
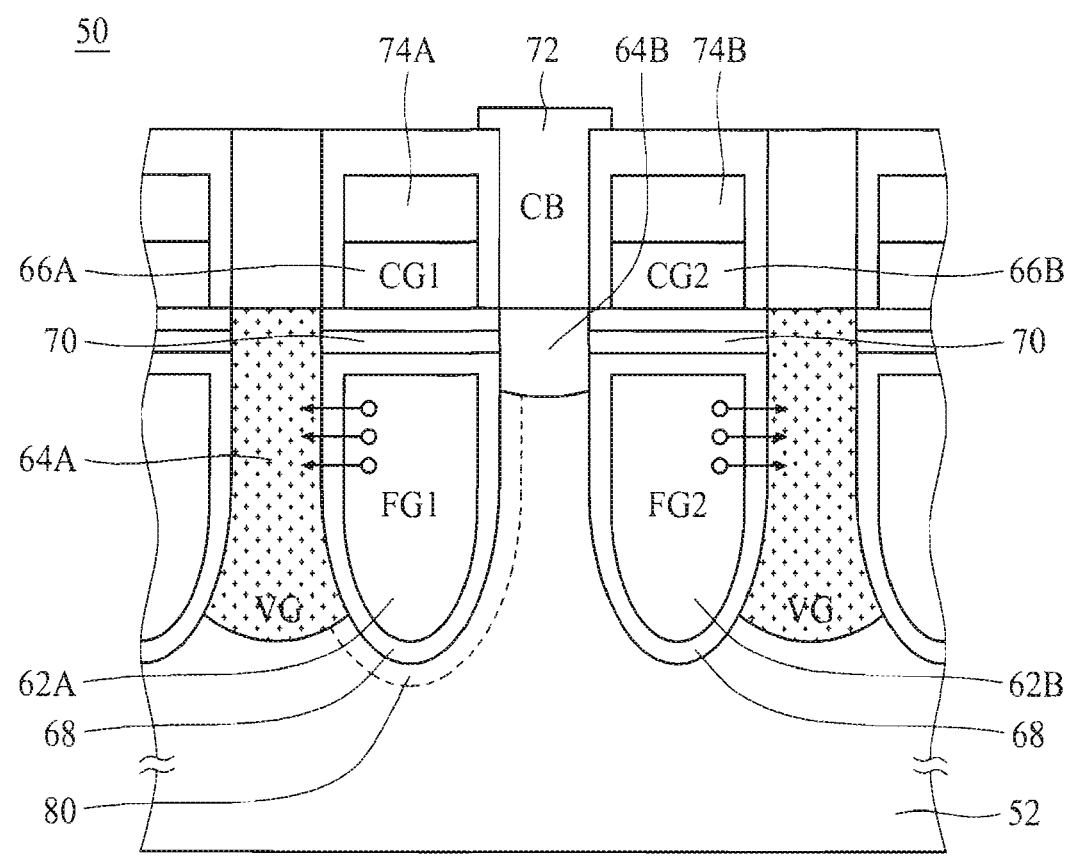
FIG. 5 illustrates the erasing operation of the flash memory cell according to one embodiment of the present invention.

FIG. 5 illustrates the erasing operation of the flash memory cell 50 according to one embodiment of the present invention. The term "erasing operation" is used herein to refer to an operation of removing electrons from the floating gate. During an erasing operation, the third voltage applied to a first doped region 62A is positive, and the first conductor 66A, the second conductor 66B and the second doped region 64B are floating, i.e., the first voltage, the second voltage and the fourth voltages are selected from the range of the third voltage to the ground voltage. Consequently, electrons can be removed from the first charge-trapping region 62A and the second charge-trapping region 62B to the first doped region 62A through the Fowler-Nordheim tunneling mechanism, as shown in the following table:

| Erasing biasing condition | | | |
|---|---|---|---|
| CB | VG | CG1 | CG2 |
| Floating | High | Floating | Floating |

Figure 6:
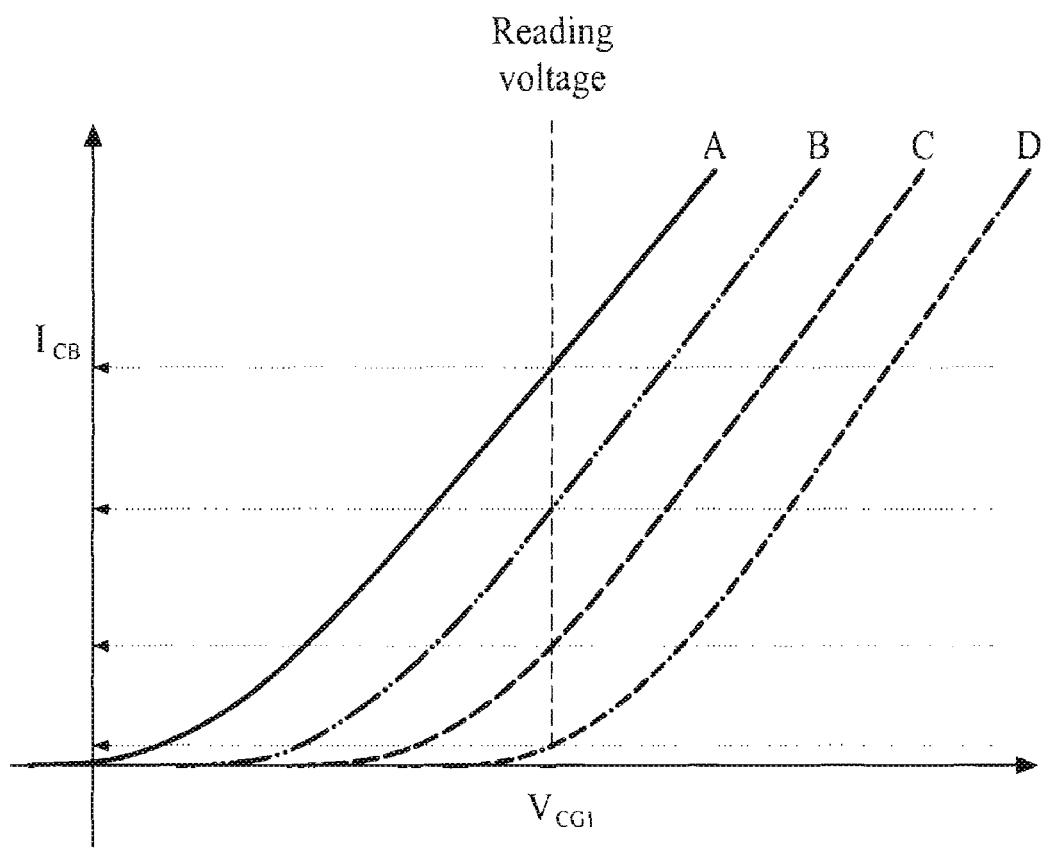
FIG. 6 illustrates the conduction behavior of the carrier channel after different programming operations.

FIG. 6 illustrates the conduction behavior of the carrier channel 80 after different programming operations. As discussed in the previous paragraph, the threshold voltage to turn on the carrier channel 80 depends on the charging levels of the first charge-trapping region 62A (FG1) and the second charge-trapping region 62B (FG2), as shown in the following table:

| Curve | FG1 | FG2 | Vth |
|-------|------|------|-----|
| A | High | High | +++ |
| B | High | Low | ++ |
| C | Low | High | + |
| D | Low | Low | Low |

During a reading operation of the flash memory cell 50, the first voltage applied to the first conductor 66A and the fourth voltage applied to the second doped region 64B are substantially the same, the third voltage applied to the first doped region 64A is the ground voltage, and the second conductor 66B is floating such that the second voltage is selected from the range of the first voltage to the third voltage. Consequently, by properly setting the reading voltage ($V_{CG1}$) applied to the first conductor 66A, the output current ($I_{CB}$) from the second doped region 64B via the bit line contact 72 (CB) shows four different levels corresponding to the four curves A-D representing the conduction behaviors of the carrier channel 80 after different programming operations. In other words, the flash memory cell 50 can store 4-bit data, i.e., it is a multi-level cell.

Although the present invention and its objectives have been described in detail, it should be understood that various changes, substitutions and alterations can be made herein without departing from the spirit and scope of the invention as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A flash memory cell, comprising:
a first charge-trapping region and a second charge-trapping region both disposed in a semiconductor substrate;
a first dielectric layer separating the semiconductor substrate from the first charge-trapping region and the second charge-trapping region;
a first conductor disposed above the first charge-trapping region, and applied by a first voltage;
a second conductor disposed above the second charge-trapping region, and applied by a second voltage;
a first doped region disposed in the semiconductor substrate at a first side of the first charge-trapping region, and applied by a third voltage;
a second doped region disposed in the semiconductor substrate at a second side of the first charge-trapping region, and applied by a fourth voltage;

a second dielectric layer separating the first charge-trapping region from the first conductor and separating the second charge-trapping region from the second conductor; and
wherein during a programming operation, the third voltage is a ground voltage, the fourth voltage is positive, and the first voltage and the second voltage are selected from the range of the third voltage to the fourth voltage, the second charge-trapping region is configured to influence the conduction behavior of a carrier channel in the semiconductor substrate under the first charge-trapping region, the first conductor and the second conductor are arranged in mirror-image symmetry with respect to the second doped region, and the first charge-trapping region and the second charge-trapping region are arranged in mirror-image symmetry with respect to the second doped region.

2. The flash memory cell of claim 1, wherein the second conductor is configured to control a charging level of the second charge-trapping region.

3. The flash memory cell of claim 1, wherein the second doped region is between the first charge-trapping region and the second charge-trapping region.

4. The flash memory cell of claim 1, further comprising a bit line contact disposed on the second doped region.

5. The flash memory cell of claim 1, wherein the first charge-trapping region and the second charge-trapping region form a double gate structure such that the semiconductor substrate between the first charge-trapping region and the second charge-trapping region is fully depleted during a reading operation.

6. The flash memory cell of claim 5, wherein the second doped region is sandwiched between the first charge-trapping region and the second charge-trapping region, and the semiconductor substrate below the second doped region is fully depleted during a reading operation.

7. The flash memory cell of claim 5, wherein the first dielectric layer serves as a tunnel oxide layer and electrically separates the second doped region from the first charge-trapping region and the second charge-trapping region.

8. The flash memory cell of claim 1, wherein the flash memory cell occupies a theoretical minimum area of 8 $F^2$, and F represents the critical dimension.

9. The flash memory cell of claim 1, wherein the flash memory cell is configured to store 4-bit data.

10. A method for operating a flash memory cell, comprising the steps of:
applying a first voltage to a first conductor disposed above a first charge-trapping region in a semiconductor substrate;
applying a second voltage to a second conductor disposed above a second charge-trapping region in the semiconductor substrate;
applying a third voltage to a first doped region disposed in the semiconductor substrate at a first side of the first charge-trapping region; and
applying a fourth voltage to a second doped region disposed in the semiconductor substrate at a second side of the first charge-trapping region;
wherein the first conductor and the second conductor are arranged in mirror-image symmetry with respect to the second doped region, and the first charge-trapping region and the second charge-trapping region are arranged in mirror-image symmetry with respect to the second doped region, during a programming operation, the third voltage is a ground voltage, the fourth voltage is positive, and the first voltage and the second voltage are selected from the range of the third voltage to the fourth voltage.

11. The method for operating a flash memory cell of claim 10, wherein during the programming operation, the first voltage, the second voltage and the fourth voltage are substantially the same such that charge carriers are injected into the first charge-trapping region and the second charge-trapping region.

12. The method for operating a flash memory cell of claim 10, wherein during the programming operation, the first voltage and the fourth voltage are substantially the same, and the second voltage is smaller than the first voltage, such that charge carriers are injected into the first charge-trapping region.

13. The method for operating a flash memory cell of claim 10, wherein during the programming operation, the second voltage and the fourth voltage are substantially the same, and the first voltage is smaller than the second voltage, such that charge carriers are injected into the second charge-trapping region.

14. The method for operating a flash memory cell of claim 10, wherein during the programming operation, the first voltage and the second voltage are smaller than the fourth voltage.

15. The method for operating a flash memory cell of claim 10, wherein during an erasing operation, the third voltage is positive, and the first voltage, the second voltage and the fourth voltages are selected from the range of the third voltage to the ground voltage.

16. The method for operating a flash memory cell of claim 10, wherein during a reading operation, the first voltage and the fourth voltage are substantially the same, the third voltage is the ground voltage, and the second voltage is selected from the range of the first voltage to the third voltage.

* * * * *